United States Patent
Fenech Saint Genieys

(10) Patent No.: US 7,093,174 B2
(45) Date of Patent: Aug. 15, 2006

(54) TESTER CHANNEL COUNT REDUCTION USING OBSERVE LOGIC AND PATTERN GENERATOR

(75) Inventor: David Fenech Saint Genieys, Malakoff (FR)

(73) Assignee: Mentor Graphics Corporation, Wilsonville, OR (US)

( * ) Notice: Subject to any disclaimer, the term of this patent is extended or adjusted under 35 U.S.C. 154(b) by 397 days.

(21) Appl. No.: 10/782,410

(22) Filed: Feb. 17, 2004

(65) Prior Publication Data

US 2005/0193295 A1    Sep. 1, 2005

(51) Int. Cl.
*G01R 31/28* (2006.01)
*G06F 11/00* (2006.01)
*G06F 7/02* (2006.01)

(52) U.S. Cl. ............... 714/724; 714/732; 714/738; 714/46

(58) Field of Classification Search ............... None
See application file for complete search history.

(56) References Cited

U.S. PATENT DOCUMENTS

| | | | | |
|---|---|---|---|---|
| 5,694,401 | A  * | 12/1997 | Gibson ................ | 714/728 |
| 6,789,221 | B1 * | 9/2004  | Hapke ................. | 714/733 |
| 6,829,740 | B1 * | 12/2004 | Rajski et al. ......... | 714/729 |
| 2003/0210069 | A1* | 11/2003 | Kikuchi et al. ...... | 324/765 |

* cited by examiner

*Primary Examiner*—Christine T. Tu
(74) *Attorney, Agent, or Firm*—Banner & Witcoff, Ltd

(57) ABSTRACT

Test logic supports the testing of an electronic circuit, where the number of ports of the electronic circuit exceeds the number of available tester IO channels. In some examples, the test logic utilizes observe logic in order to analyze the output ports that are masked so that the number of tester IO channels need not be expanded. Digital data from an electronic circuit is compacted by processing the data with a signature compactor to determine a signature corresponding to the output data. A comparator may compare the determined signature with the correct signature to provide a "go/no-go" indication to a process through a processor channel. Providing test coverage using a signature averts the necessity of having additional tester IO channels to cover the associated section of the electronic circuit. Additionally, a pattern generator may be supported by the test logic to provide digital activity for the electronic circuit.

26 Claims, 9 Drawing Sheets

US 7,093,174 B2

TESTER CHANNEL COUNT REDUCTION USING OBSERVE LOGIC AND PATTERN GENERATOR

FIELD OF THE INVENTION

The present invention pertains to the field of testing electronic circuits. At least some aspects of this invention relate to testing integrated circuits that have more input/output (IO) pins than the number of available tester channels.

BACKGROUND OF THE INVENTION

Electronic circuitry, such as integrated circuits (ICs), is becoming increasingly complex. For example, an integrated circuit is typically assuming more functionality while executing the associated functionality at greater speeds. In order to support the functionality, which necessitates control of circuitry external to the integrated circuit (often referred to as a "chip"), more input/output (IO) pins are needed to interconnect with the external circuitry. When testing a chip, the operation of a section of the chip that is associated with an IO pin typically requires observability of the IO pin. More complex chips may require more IO pins, which may require observability for verifying the operation of the chip. Apparatuses for testing chips typically are expensive, and adding additional testing channels (a testing channel being associated with an IO pin) further increases the cost of these apparatuses. A manufacturer of the chip would want to invest in testing apparatus that adequately tests the chip at the lowest amount of investment. Thus, the manufacturer would desire to adequately test a chip only with the necessary number of available testing channels in order to avert an additional investment.

FIG. 1 illustrates test logic 100 for testing electronic circuitry with the number of available input/output (IO) channels in accordance with prior art. Test logic 100 comprises a Field-Programmable Gate Array (FPGA) module 103 and a trace circuit 101. FPGA module 103 is typically utilized to emulate (prototype) an integrated circuit design before committing the design to hardwired chips. Trace circuit 101 supports the emulation of the prototyped circuit.

Input ports IP1 105–IP6 115 provide digital stimulation (activity) of trace circuit 101, and output ports (OP1 167–OP6 177) allow access to the output from the trace circuit.

In the example shown in FIG. 1, only two tester input/output (IO) channels 151 and 153 are shown, although test logic typically supports larger numbers of tester IO channels (typically, on the order of a few hundred). Tester IO channels 151 and 153 connect to output port 1 (OP1) 167 and output port 2 (OP2) 167, respectively, as shown in FIG. 1. However, the number of available tester IO channels is typically limited because of architectural and budgetary constraints. In the example shown in FIG. 1, trace circuit 101 has more output ports than can be accommodated by the available number of tester IO channels (i.e., OP3 171, OP4 173, OP5 175, and OP6 177 are not accommodated by tester IO channels in the illustrated example). With the prior art, when there are not enough tester IO channels to cover all the output ports (corresponding to output signals), the user typically masks the output ports (where the masked output ports are not connected to any tester IO channels) that are not deemed as important as other output ports. Because test logic 100 does not have more available tester IO channels, output ports OP3 171–OP6 177 are not observable, and thus the associated circuitry of trace circuitry 101 may not be verified for proper operation. In other words, an undetectable fault in trace circuit 101 may exist.

Thus, it would be an advancement in the field of testing electronic circuitry to provide apparatuses and methods that reduce the number of required testing channels while still adequately testing the electronic circuitry. It also would be an advancement in the field of testing electronic circuitry to allow more complete visibility of an electric circuit under test using an existing number of testing channels.

BRIEF SUMMARY OF THE INVENTION

At least some aspects of the present invention provide methods and apparatuses that support the testing of electronic circuits, where the number of input/output (IO) ports of the electronic circuit exceeds the number of available tester IO channels. In at least some examples, the invention utilizes observe logic in order to analyze at least some output ports that are masked (and not observable via the IO tester channels) so that the number of tester IO channels need not be expanded.

With one aspect of the invention, digital data from an electronic circuit (corresponding to an associated section of the electronic circuit) is compacted by processing the data with a signature compactor. The signature compactor compacts the data into a signature, which is a compacted resulting sequence. If the electronic circuit is operating properly (i.e., there are no faults in the electronic circuit), the signature determined by the signature comparator will be equal to a correct signature, which is known a priori. A comparator may compare the determined signature with the correct signature to provide a "go/no-go" indication to a process through a processor channel. Providing test coverage using a signature, in at least some instances, averts the necessity of providing additional tester IO channels in order to cover the associated section of the electronic circuit.

With another aspect of the invention, a comparator processes digital data from the electronic circuit. In such a case, an expected value is compared with an actual value. The comparator output is presented through a processor channel in order to determine whether the electronic circuit is operating properly.

With another aspect of the invention, a pattern generator is used to generate test patterns as digital activity (which correspond to digital input signals) for the electronic circuit. The test patterns may be deterministic or pseudo random. Moreover, the source of activity may be selected as either the pattern generator or another component of the test logic. In an embodiment, test logic utilizes a multiplexer for the selection of the source of activity to apply to the test logic.

BRIEF DESCRIPTION OF THE DRAWINGS

Illustrative embodiments of the present invention are illustrated by way of example in the accompanying drawings. The drawings are not, however, intended to limit the scope of the present invention.

DETAILED DESCRIPTION

The following disclosure describes examples of novel architecture of apparatuses for testing electronic circuitry. Such architecture may be used, in at least some instances, to reduce a number of input/output (I/O) channels needed to provide full visibility or near-full visibility into operation of an electronic circuit under test.

Definitions for the following terms are included to facilitate an understanding of the detailed description. Unless otherwise noted or clear from the context, the following terms will have the meanings provided below:

observable signal—a signal that can be monitored, either directly or indirectly, in order to ascertain proper operation of a corresponding section of an electronic circuit within an acceptable degree of probability. A signal may be observable if the signal affects another signal and if the other signal can be directly monitored.

Figure 1:
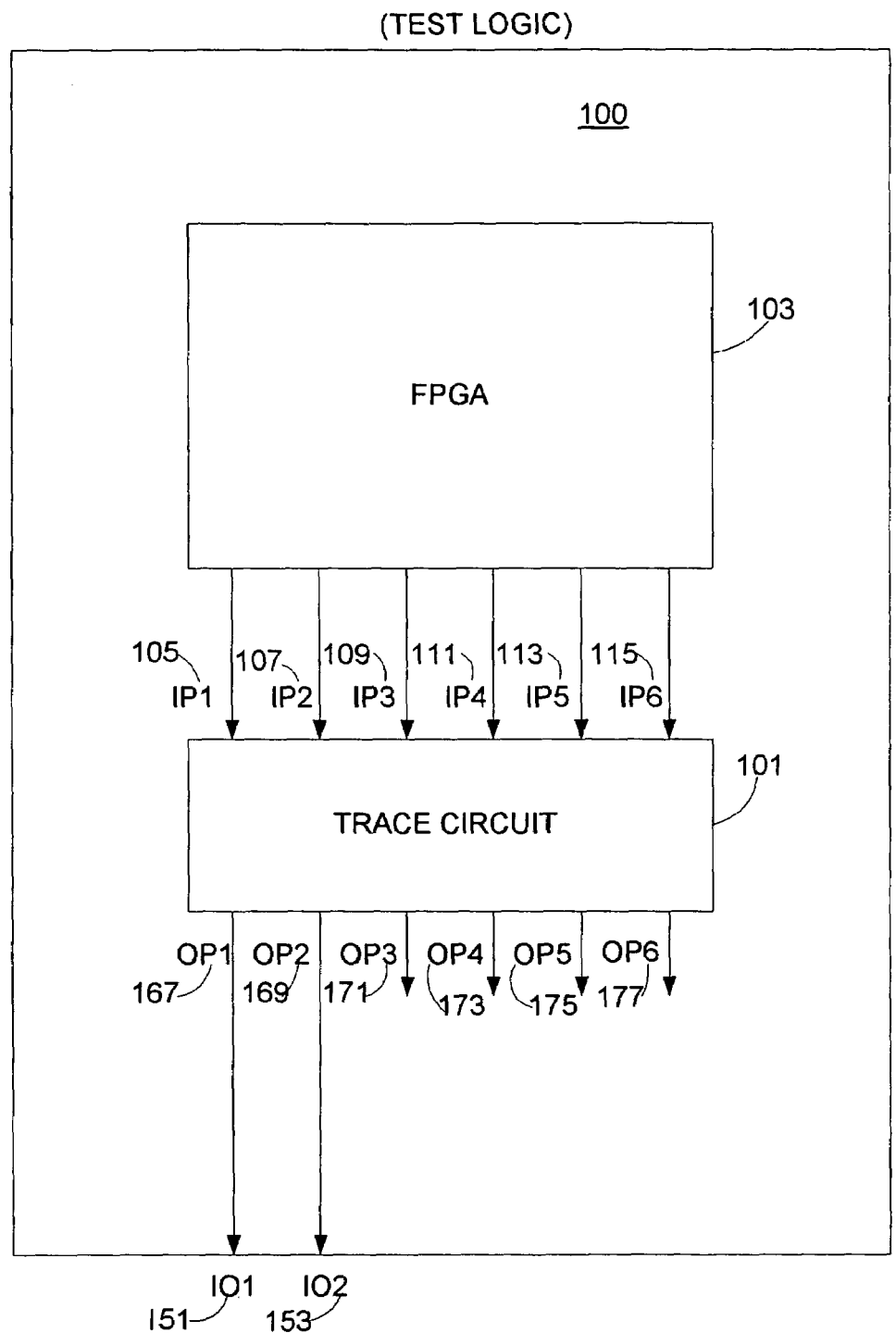
FIG. 1 illustrates test logic for testing electronic circuitry with the number of available tester input/output (IO) channels in accordance with prior art.
Figure 2:
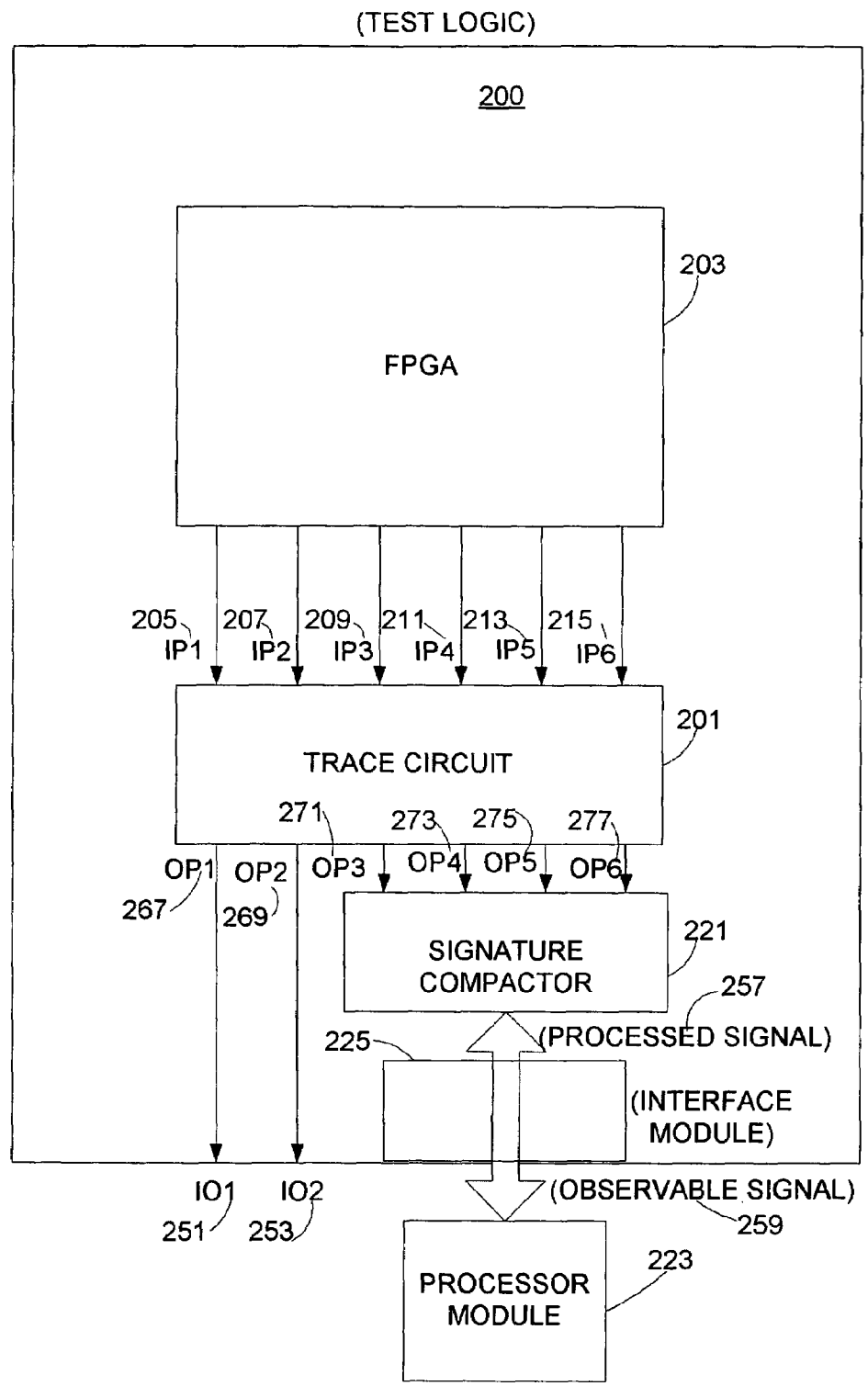
FIG. 2 illustrates a first example of test logic for testing electronic circuitry by increasing the visibility of the electronic circuitry with available tester IO channels in accordance with an embodiment of the invention.

FIG. 2 illustrates test logic 200 for testing electronic circuitry by increasing the visibility of the electronic circuitry with available tester IO channels in accordance with an embodiment of the invention. In addition, test logic 200 may reduce a necessary number of tester IO channels while providing a same degree of visibility of the electronic circuitry. Because test logic 200 supports only a limited number of tester IO channels (IO1 251 and IO2 253 in the illustrated example), the limited number of available tester IO channels 251 and 253 cannot accommodate all of the output ports OP1 267–OP6 277. Therefore, it is not possible to observe all of the outputs of the circuit in order to detect faults of a trace circuitry 201. (While the example in FIG. 2 illustrates detecting a fault in trace circuit 201, the embodiment supports the detection of faults in other components of test logic 200, e.g., FPGA module 203 or in an electronic circuit being tested by test logic 200.) While the illustrated test logic 200 has the same number of available tester IO channels (tester IO channels 251 and 253) as test logic 100 illustrated in FIG. 1, the signals associated with output ports OP3 271–OP6 277 of a trace circuit 201 are observable through a signature compactor 221 and an interface module 225 (notably, the corresponding output ports OP3 171 through OP6 177 were simply not observable in the prior art example of FIG. 1). A processor module 223 obtains an observable signal 259 from interface module 225 through a processor channel in order to determine if the associated section of trace circuit 201 is properly operating (i.e., there are no detectable faults). Processor module 223 may be external to test logic 200, as illustrated in the example of FIG. 2, or it may be internal to the test logic 200 in other embodiments. While the observable signal in the example system of FIG. 2 is exposed over a processor channel, in other embodiments of the invention, the observable signals may be exposed in other suitable or desired manners, such as through an available IO channel.

In the example shown in FIG. 2, test logic 200 verifies trace circuit 201, which is a component of test logic 200. However, the embodiments shown in FIGS. 2–7 may verify the operation of another electronic circuit that may be another component (e.g., a FPGA module 203 that supports emulation) of test logic 200 or that may not be a component of test logic 200. For example, test logic 200 may verify the operation of an integrated circuit (not shown) that is not functionally part of test logic 200 but that is held in a test fixture so that the integrated circuit can be verified by test logic 200.

In the examples shown in FIGS. 1 and 2, test logic 200 provides a greater degree of visibility of the trace circuit than does test logic 100 with the same number of tester IO channels. Alternatively, without the data compaction provided by signature compactor 221, the number of tester IO channels can be increased to increase the visibility of trace circuit 201.

Referring to the embodiment shown in FIG. 2, signature compactor 221 compacts data derived from output ports OP3 271–OP6 277. (A more detailed description of signature compactor 221 is provided with FIGS. 8 and 9.) Signature compactor 221 processes output signals present at output ports OP3 271–OP6 277, while trace circuit 201 is running at circuit speed. After trace circuit 201 runs for a desired time interval, signature compactor 221 determines a signature (corresponding to a processed signal 257). (The signature is typically a final state of the signature compactor, which consists of sequential circuitry.) In the illustrated example embodiment, signature compactor 221 processes signals from ports that are configured as output ports (i.e., OP3 271–OP6 277). The signature is a resulting sequence of signature compactor 221, where the signature is typically small with respect to the number of inputs to signature compactor 221. Because the data is being compacted, thus causing a loss of information, there is a probability that the signature will not indicate a faulty circuit when a fault exists. Such a case is often referred as "aliasing." However, the probability of such aliasing is typically small, and it may be reduced to an acceptable level by appropriately selecting design parameters for signature compactor 221 (e.g., by increasing the length of the shift register configurations, as will be described in more detail in conjunction with FIG. 8).

In the example, shown in FIG. 2, the user typically will partition the output ports so that the output ports corresponding to critical circuitry are not masked (e.g., output ports OP1 267 and OP2 269 in the illustrated example). By directly providing their outputs over the available tester IO channels IO1 and IO2, there is a very high probability of detecting a fault visible through these critical output ports OP1 and OP2 (e.g., 100% certainty or essentially 100% certainty). On the other hand, output signals associated with output ports OP3 271 through OP6 277, are processed by signature compactor 221. While the probability of detecting a fault visible through output ports OP3 through OP6 may not be 100%, it may be sufficiently small to pose an acceptable evaluation standard.

In the example shown in FIG. 2, processed signal 257 is buffered by an interface module 225 in order to expose observable signal 259 to processor module 223. While interface module 225 may be transparent or essentially transparent (in which processed signal 257 is equal to or essentially equal to observable signal 259), in other embodiments, interface module 225 may store processed signal 259 in a register for subsequent retrieval by processor module 223, or it may modify signal characteristics, e.g., modify voltage levels in order to be compatible with processor module 223, and the like.

Figure 3:
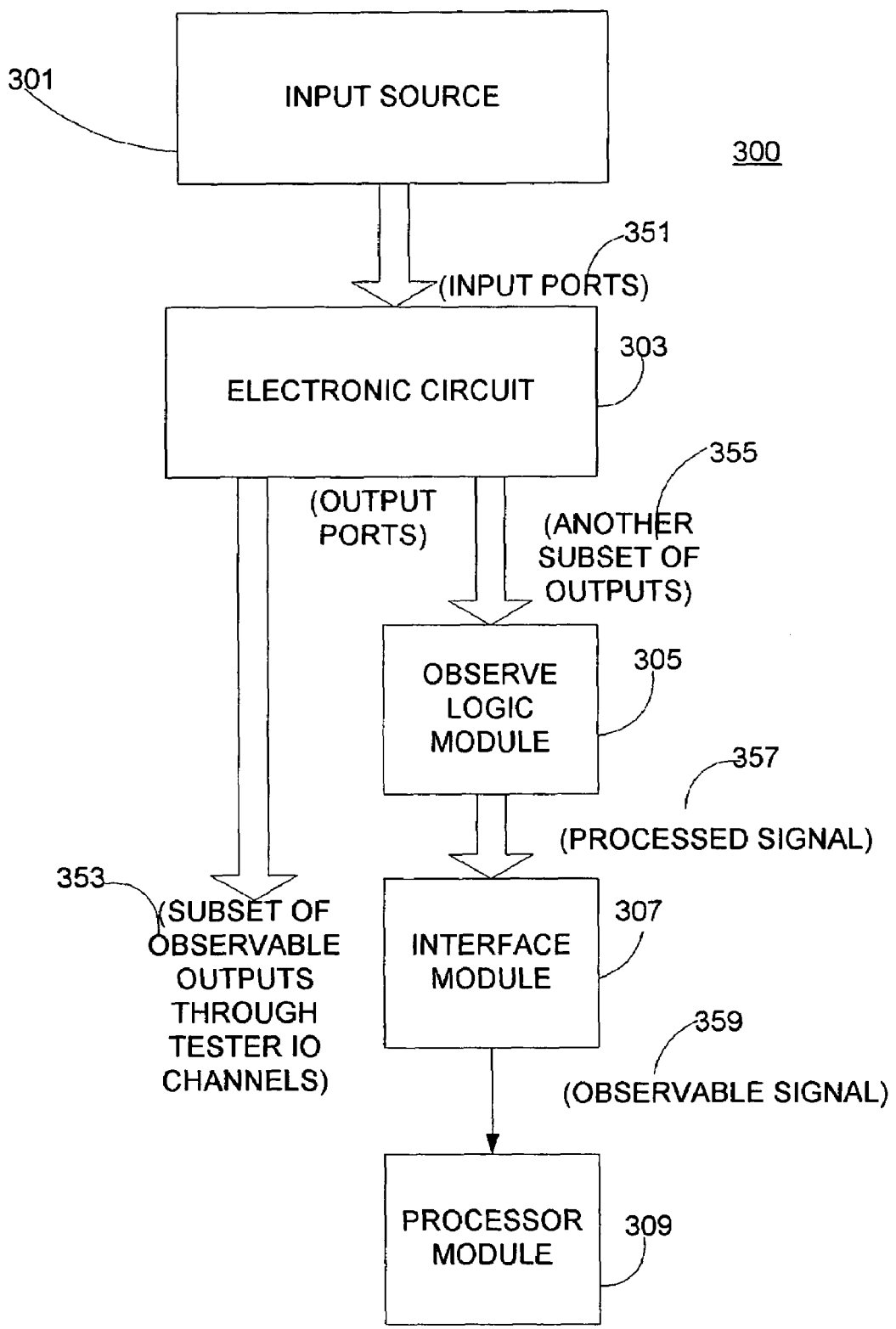
FIG. 3 illustrates an example architecture of test logic, as shown in FIGS. 2, 4, 5, 6, and 7, in accordance with an embodiment of the invention.

FIG. 3 illustrates an example architecture 300 of test logic, which may be used, for example, in the various systems illustrated in FIGS. 2, 4, 5, 6, and 7, in accordance with embodiments of the invention. An input source 301 provides digital activity for an electronic circuit 303. In the example shown in FIG. 2, input source 301 corresponds to FPGA module 203; however, in FIG. 7 input source 301 corresponds to pattern generator 741. Any suitable input source 301 may be used to provide digital activity for the circuit without departing from the invention.

Electronic circuit 303 has a plurality of output ports that are partitioned into subsets of output ports comprising a subset of observable outputs 353 and another subset of outputs 355. The user typically partitions signals that are to be verified into a plurality of subsets, depending upon whether associated circuitry is deemed by the user to be critical or not critical. In the example shown in FIG. 3, the section of circuitry associated with subset 353 is deemed to be critical. However, the section of circuitry associated with subset 355 is not deemed as being as critical, in which a probability of detecting faults need not be 100% certain or essentially 100% certain. In architecture 300, observe logic module 305 corresponds to signature compactor 221 in FIG. 2, to comparator 431 in FIG. 4, to signature compactor 521 in FIG. 5, to signature compactor 621 in FIG. 6, and to signature compactor 721 in FIG. 7. An interface module 307 corresponds to interface module 225 in FIG. 2, to interface module 425 in FIG. 4, to interface module 525 in FIG. 5, to interface module 625 in FIG. 6, and to interface module 725 in FIG. 7. A processor module 309 corresponds to processor module 223 in FIG. 2, to processor module 423 in FIG. 4, to processor module 523 in FIG. 5, to processor module 623 in FIG. 6, and to processor module 723 in FIG. 7.

Figure 4:
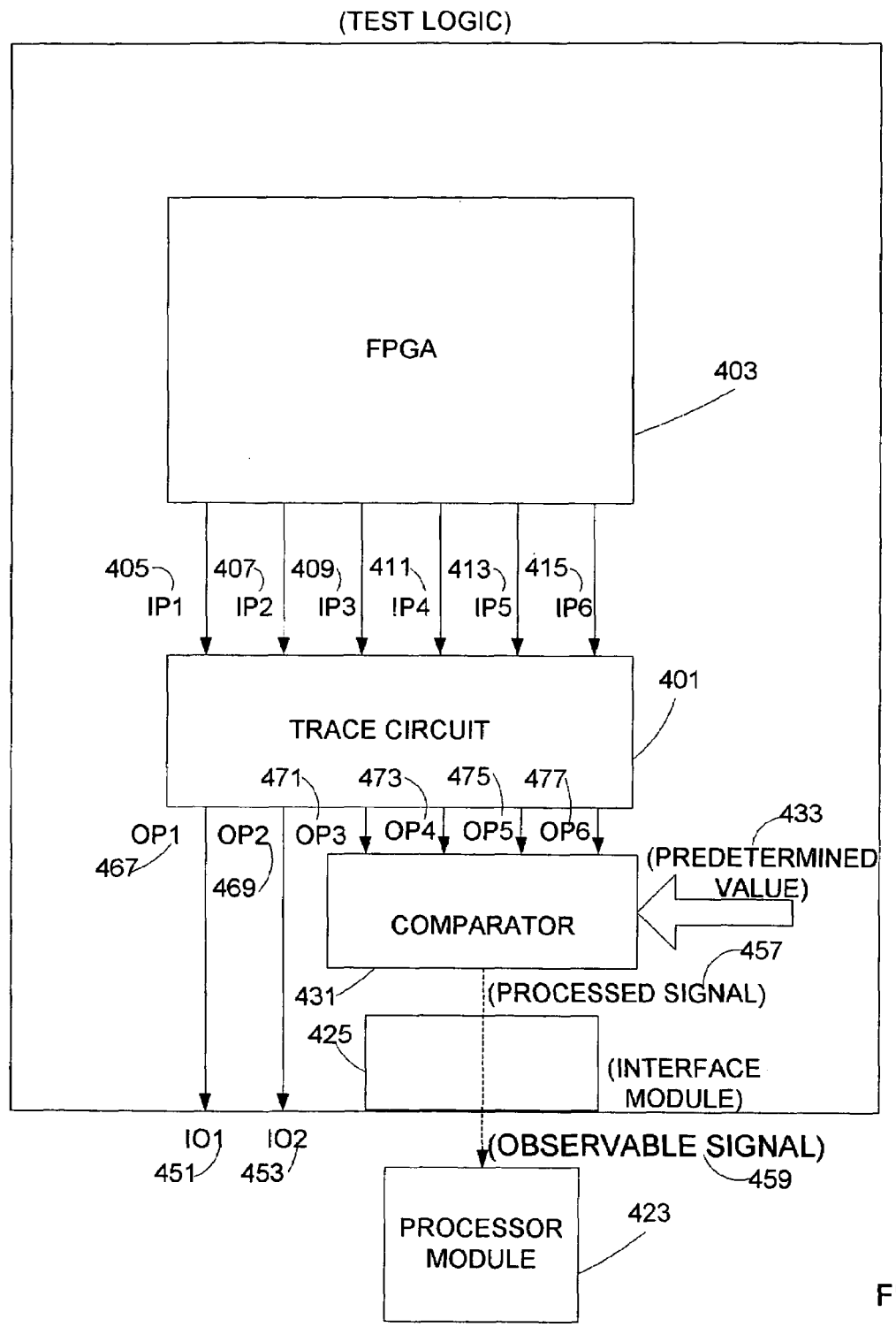
FIG. 4 illustrates a second example of test logic for testing electronic circuitry by increasing the visibility of the electronic circuitry with available tester IO channels in accordance with an embodiment of the invention.

FIG. 4 illustrates test logic 400 for testing electronic circuitry by increasing the visibility of the electronic circuitry with available tester IO channels in accordance with an embodiment of the invention. Test logic 400 is similar to test logic 200; however, observe logic 305 (as shown in FIG. 3) comprises a comparator 431 rather than the signature compactor 221 as shown in FIG. 2. A data pattern (that is formed by signals from output ports OP3 471–OP6 477) is compared to a predetermined value 433, which is known to be correct a priori. In the embodiment illustrated in FIG. 4, predetermined value 433 is obtained from a component of test logic 400 (e.g., a FPGA module 403), or, alternatively, from an external component, such as from the processor module 423. If trace circuit 401 is running at chip speed, an interface module 425 may comprise a register to capture the result of the comparison (corresponding to processed signal 457) so that processor module 423 can subsequently read the result (corresponding to observable signal 459). A processed signal 457 indicates either a "correct comparison" or an "incorrect comparison." Interface module 425 presents the corresponding results to processor module 423 as a "go/no-go" indication (indicating whether the section of trace circuit 401 is properly operating or is not properly operating) of the operation of trace circuit 401.

Figure 5:
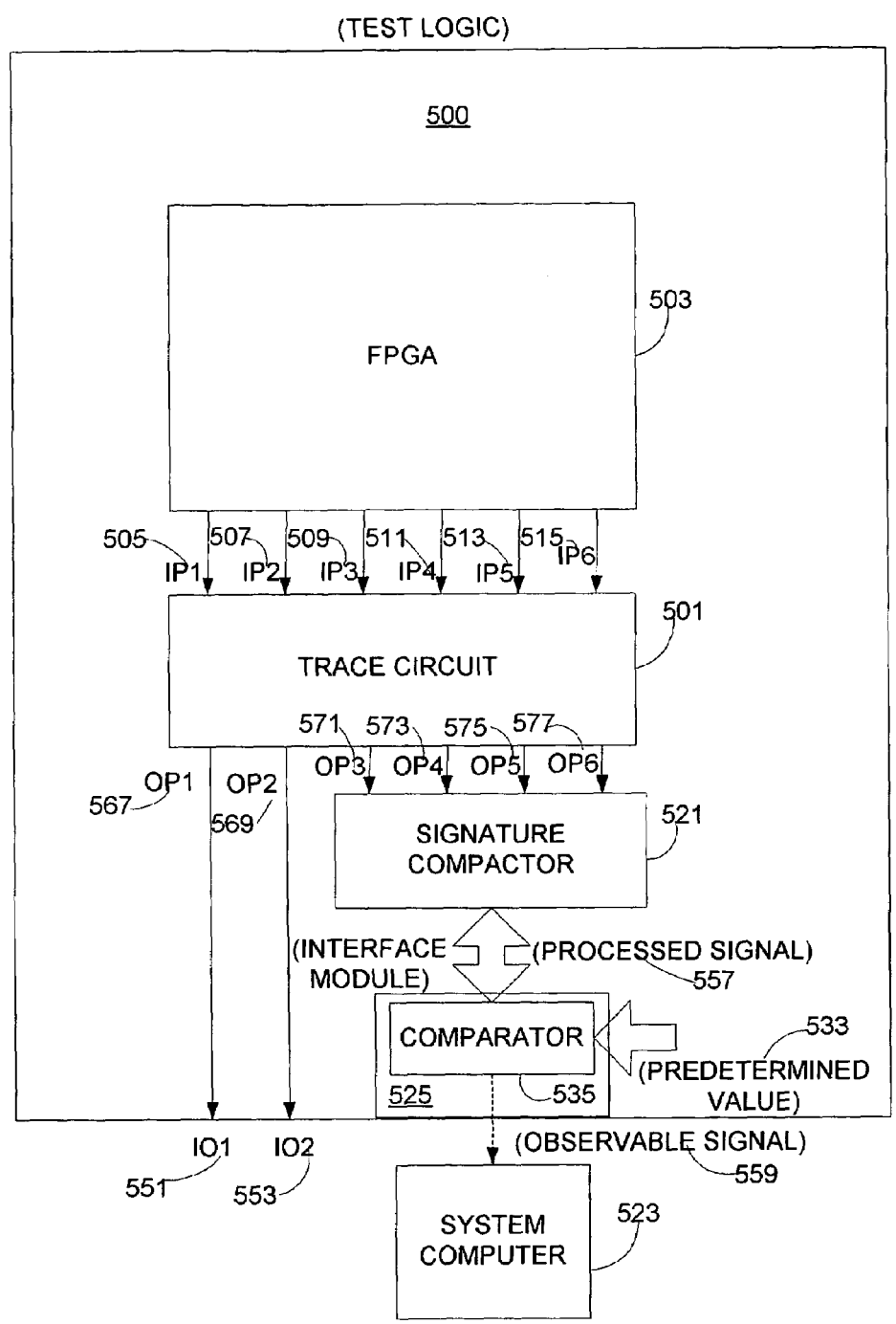
FIG. 5 illustrates a third example of test logic for testing electronic circuitry by increasing the visibility of the electronic circuitry with available tester IO channels in accordance with an embodiment of the invention.

FIG. 5 illustrates test logic 500 for testing electronic circuitry by increasing the visibility of the electronic circuitry with available tester IO channels in accordance with an embodiment of the invention. Test logic 500 is similar to test logic 200; however, in this example, the interface module 525 includes a comparator 535. Comparator 535 compares a signature generated by a signature compactor 521. As with signature compactor 221, signature compactor 521 generates a signature in response to data patterns (that are formed by signals from output ports OP3 571–OP6 577) provided by trace circuit 501. Comparator 535, which is contained in interface module 525, compares the signature (corresponding to a processed signal 557) with a predetermined value 533, which is known to be the correct signature. The output of comparator 535 corresponds to observable signal 559. In the embodiment, predetermined value 533 is provided by a system computer 523, although the predetermined value 533 may be provide by another external element, by a component of test logic 500, or in any other suitable manner without departing from the invention. An observable signal 559 (which is an output of comparator 535) provides a "go/no-go indication" to system computer 523.

Figure 6:
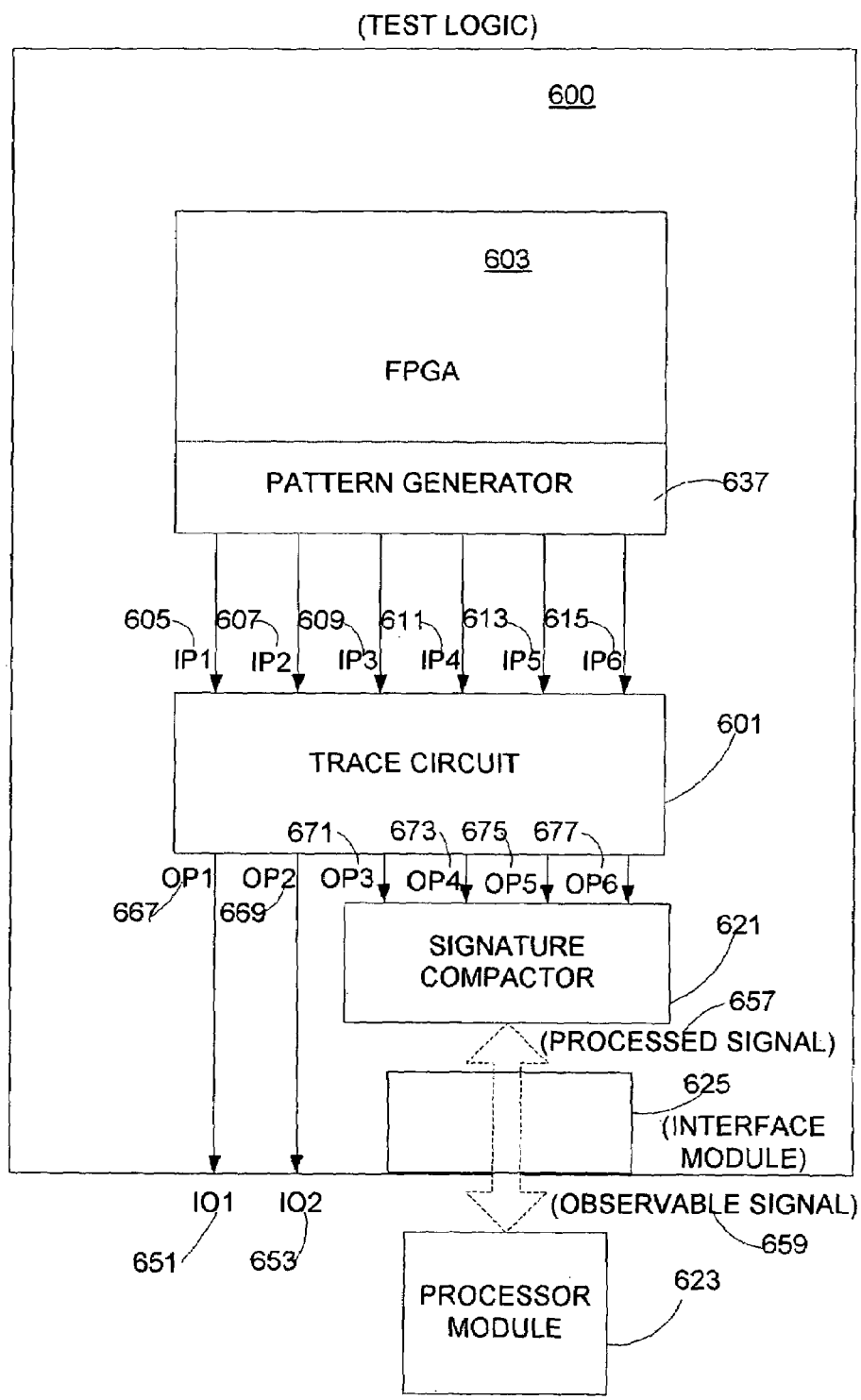
FIG. 6 illustrates a fourth example of test logic for testing electronic circuitry in accordance with an embodiment of the invention.

FIG. 6 illustrates test logic 600 for testing electronic circuitry by increasing the visibility of the electronic circuitry with available tester IO channels in accordance with an embodiment of the invention. A FPGA module 603 supports emulation, as with FPGA module 203 in FIG. 2, as well as a pattern generator 637. Pattern generator 637 corresponds to a specific user design mapped into FPGA module 603. Pattern generator 637 generates digital patterns having a deterministic pattern or a pseudo random pattern. While FPGA module 203 provides activity for trace circuit 201 in FIG. 2, the digital patterns result from circuitry that is being emulated. Pattern generator 637 typically provides digital activity that enable test logic 600 to determine proper operation (e.g., corresponding in desired signature values) more expeditiously than with FPGA module 203. The other components of test logic 600 are similar to the corresponding components of test logic 600, where a trace circuit 601 corresponds to trace circuit 201, a signature compactor 621 corresponds to signature compactor 221, an interface module 625 corresponds to interface module 225, and a processor module 623 corresponds to processor module 223. Also, a processed signal 657 corresponds to processed signal 257 and an observable signal 659 corresponds to observable signal 259 as shown in FIG. 2.

Figure 7:
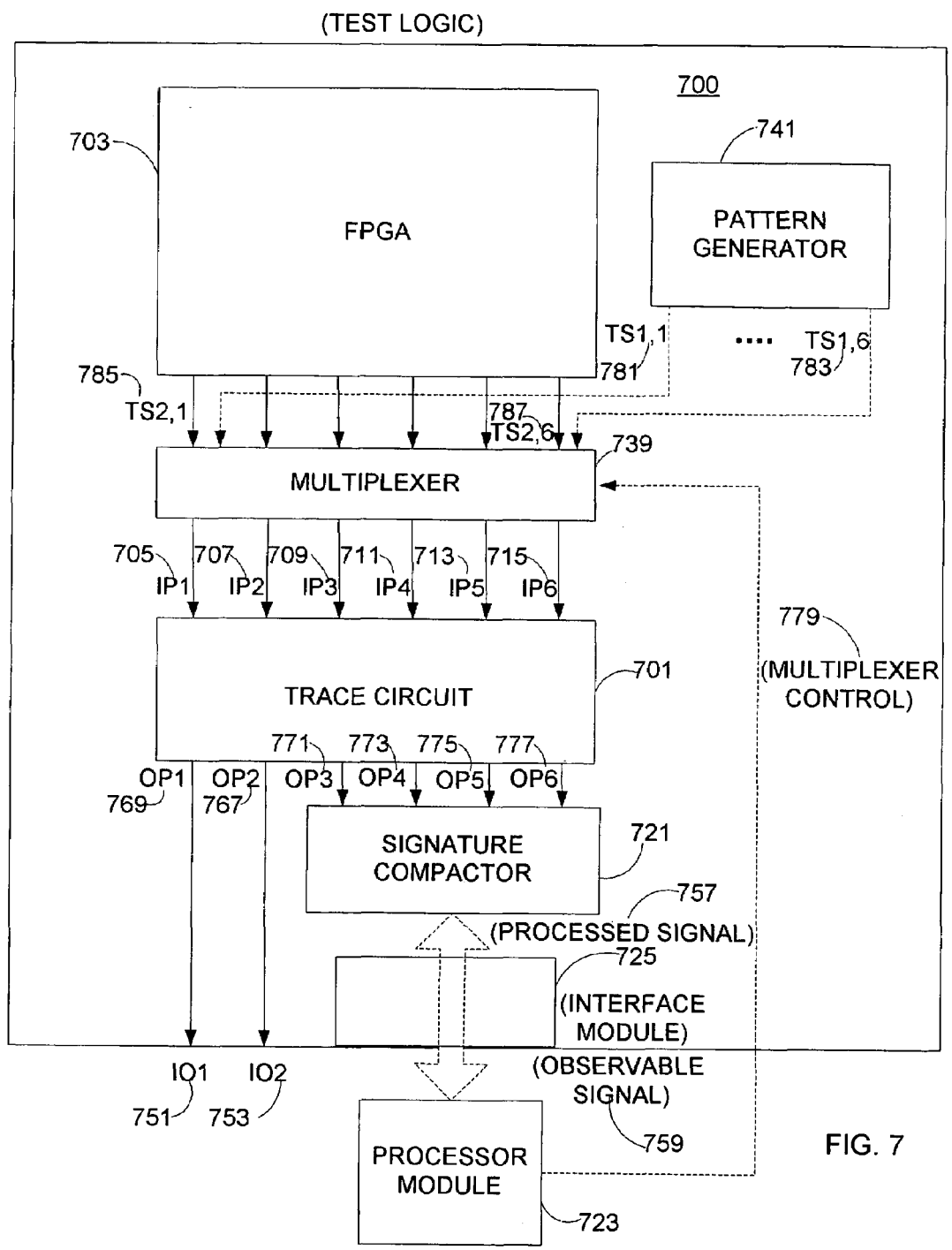
FIG. 7 illustrates a fifth example of test logic for testing electronic circuitry in accordance with an embodiment of the invention.

FIG. 7 illustrates test logic 700 for testing electronic circuitry by increasing the visibility of the electronic circuitry with available tester IO channels in accordance with an embodiment of the invention. Test logic 700 is similar to test logic 600. However, in this example, a pattern generator 741 is implemented as a separate component of the test logic 701 from the FPGA module 703. Test logic 700 selects a source of activity for the trace circuit 701 through a multiplexer 739 by providing a multiplexer control 779 from any suitable source, such as from a processor module 723. Multiplexer 739 can be configured so that IP1 signals 705–IP6 715 correspond to test signals TS2,1 785–TS2,6 787 that are generated by the emulation functionality of FPGA module 703 or with test signals TS1,1 781–TS1,6 783 that are generated by pattern generator 741. The other components of test logic 700 are similar to the corresponding components of test logic 700, where a trace circuit 701 corresponds to trace circuit 201, a signature compactor 721 corresponds to signature compactor 221, an interface module 725 corresponds to interface module 225, and a processor module 723 corresponds to processor module 223. Also, a processed signal 757 corresponds to processed signal 257 and an observable signal 759 corresponds to observable signal 259 as shown in FIG. 2.

Figure 8:
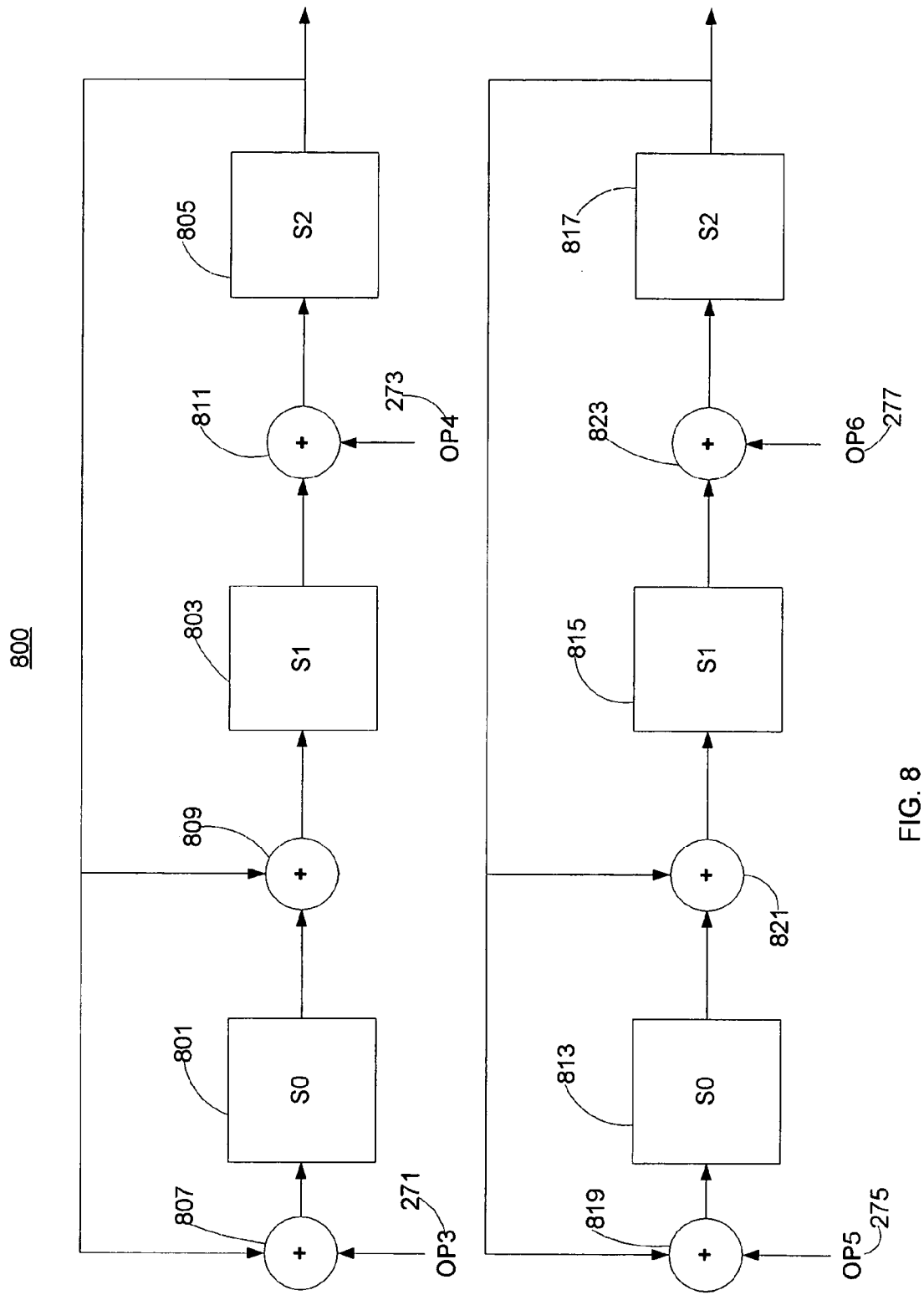
FIG. 8 illustrates an example of a signature compactor with linear feedback shift registers (LFSR) that may be used in various examples of the invention, such as in the systems shown in FIGS. 2, 5, 6, and 7.

FIG. 8 illustrates a signature compactor 800 with linear feedback shift registers (LFSR) that may be used in various systems and methods according to the invention, including in example systems 200, 500, 600, and 700 as shown in FIGS. 2, 5, 6, and 7. Signature compactor 800 comprises two shift register configurations that are clocked with a clock (not shown) of the system logic. Signature compactor processes signals received from output ports OP3 271, OP4 273, OP5 275, and OP6 277. The first shift register configuration comprises shift registers S0 801, S1 803, and S2 805. The configuration uses feedback from the previous states through exclusive OR (XOR) gates 807–811. Such a feedback configuration is often signified in the art as linear feedback shift registers (LFSR). The second shift register configuration is similarly constructed and comprises shift registers S0 813, S1 815, and S2 817 and XOR gates 819–823. Each shift register configuration processes two output port signals (which serve as inputs to the shift register configuration). The first shift register configuration processes OP3 271 and OP4 273, and the second shift register configuration processes OP5 275 and OP6 277. Because each shift register configuration processes a plurality of input signals, each configuration is often referred as a "multiple input shift register" (MISR) structure.

The signature determined by signature compactor 800 comprises the last state of the shift register configurations. In the example shown in FIG. 8, the signature corresponds to the last outputs of shift registers 801–805 and 813–817 after compacting data from a trace circuit, such as trace circuit 201 illustrated in FIG. 2. The length of the shift register configurations is engineered so that the probability of aliasing is within an acceptable probability. For example, when each shift register configuration has three shift registers (k=3), the probability of aliasing (i.e., obtaining a correct signature even though trace circuit 201 has a fault that is undetected) is approximately $2^{-k}*100=2^{-3}\times100$ or 12.5%). For a practical situation, this probability is likely too large. However, the probability of aliasing can be substantially reduced by increasing the length of each shift register configuration (and hence the number of shift registers, e.g., such that the number of shift registers is 32 (k=32), in which the probability of aliasing is approximately $2^{-32}\times100$).

The following example illustrates the operation of signature compactor 800. The initial state of each shift registers 801, 803, 805, 813, 815, and 817 is "zero", corresponding to a configuration state of '000000'. In the example, the signature is calculated over two system clock cycles, where the values of the input signals (which are received from output ports OP3 271, OP4 273, OP5 275, and OP6 277) are '1010' preceding the first clock duration and '1100' preceding the second clock duration. After the first clock duration, the configuration state is '100100'. After the second clock duration, the configuration state is '111010'. Thus, the signature is calculated to be '111010'. The calculated signature can be compared to a predetermined value, which corresponds to trace circuit 201 (as shown in FIG. 2) that is operating properly. Signature compactor 800 may calculate the signature over a different number of clock durations, where the number of clock durations being substantially larger than two.

Figure 9:
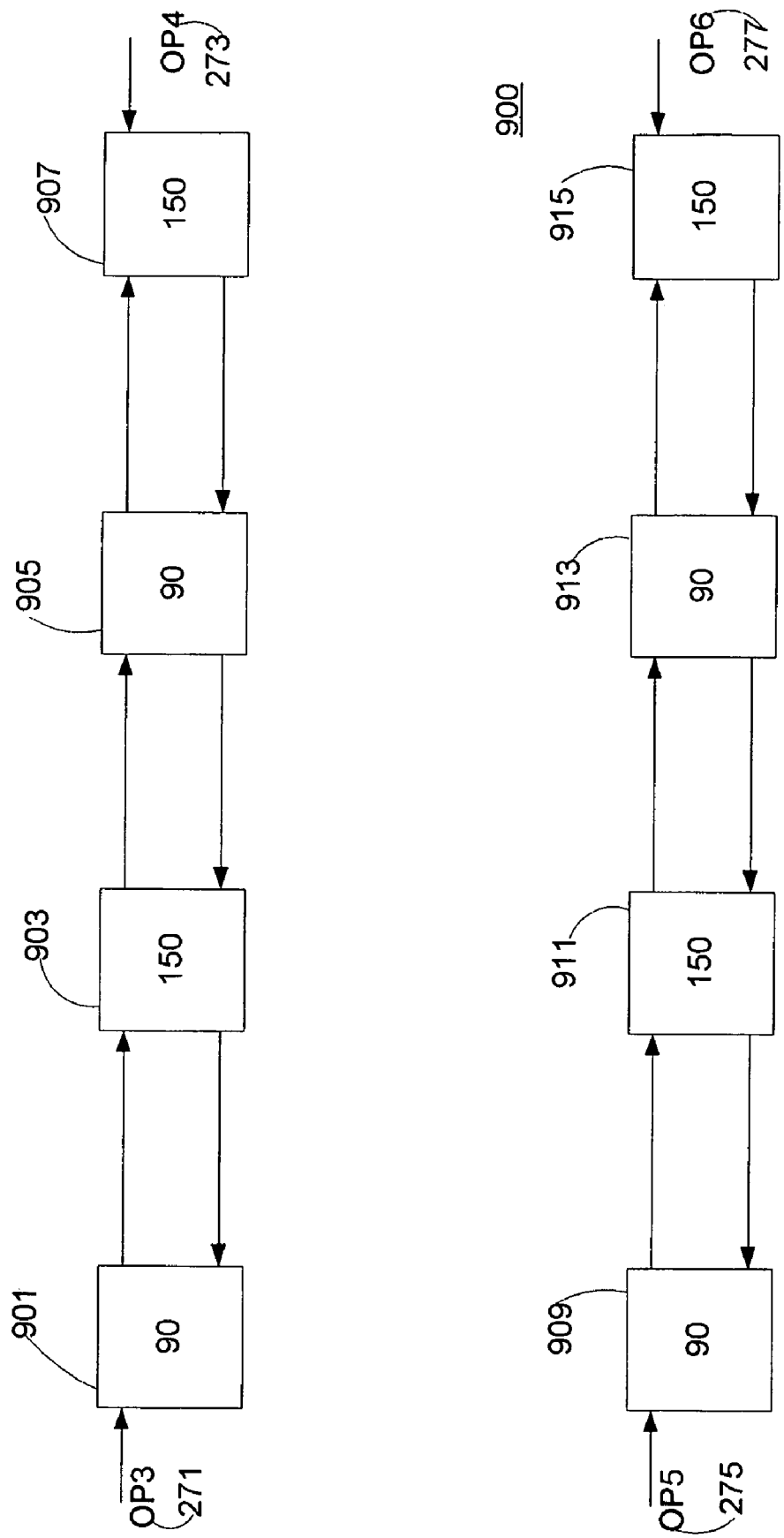
FIG. 9 illustrates an example of a signature compactor with linear cellular automata registers (LCAR) that may be used in various examples of the invention, such as in the systems shown in FIGS. 2, 5, 6, and 7.

FIG. 9 illustrates a signature compactor 900 with linear cellular automata registers (LCAR) that may be used in various systems and methods according to the invention, such as systems 200, 500, 600, and 700 shown in FIGS. 2, 5, 6, and 7. Signature compactor 900 is an alternative embodiment of the various types of signature compactors described above. Signature compactor 900 has two LCAR configurations, where each LCAR configuration comprises two types of cells that are clocked by the clock (not shown) of test logic 200. The first cell type is a rule 150 cell (cells 903, 907, 911, and 915) and a rule 90 cell (cells 901, 905, 909, and 913). (A rule 150 cell and a rule 90 cell are well known in the art of cellular automata.) The signature is the last state of the LCAR configurations after compacting digital data from trace circuit 201. The rule 150 cell computes its next state as the exclusive-OR of its present state and of the present states of its two neighbors. The rule 90 cell computes its next state as the exclusive-OR of the present states of its two neighbors. (The state of a neighbor is the current output of the neighboring cell.)

Thus, an architecture of apparatuses for testing electronic circuitry that reduces the number of testing channels, along with method associated therewith, have been described herein. While the apparatuses and methods of the present invention have been described in terms of the above-illustrated embodiments, those skilled in the art will recognize that the various aspects of the present invention are not limited to the embodiments described. The present invention can be practiced with modification and alteration within the spirit and scope of the appended claims. The description is thus to be regarded as illustrative rather than restrictive of the present invention.

What is claimed is:

1. A test logic for testing operation of an electronic circuit, comprising:
   a source that provides a plurality of test signals to a plurality of input ports of the electronic circuit;
   a plurality of tester IO channels that carry a first subset of a plurality of output signals from corresponding output ports of the electronic circuit; and
   an observe logic module that processes a second subset of the plurality of output signals in order to provide at least one processed signal, the at least one processed signal being generated from the second subset of the plurality of output signals.

2. The test logic of claim 1, further comprising:
   an interface module that enables the user to determine whether a section of the electronic circuit is properly operating by generating at least one observable signal, the at least one observable signal being derived from the at least one processed signal, the section of the electronic circuit being associated with the second subset.

3. The test logic of claim 2, wherein the interface module includes a comparator that compares the at least one processed signal with a predetermined value to provide the at least one observable signal.

4. The test logic of claim 2, wherein the interface module includes a register that stores a result generated by the observe logic module.

5. The test logic of claim 2, further comprising:
   a processor module that reads the at least one observable signal to determine whether the section of the electronic circuit is operating properly.

6. The test logic of claim 1, wherein the observe logic module includes a signature compactor.

7. The test logic of claim 6, wherein the signature compacter comprises:
a set of linear feedback shift registers (LFSR), wherein an input signal to the set of linear feedback shift registers corresponds to a corresponding output port of the electronic circuit, and wherein a LFSR output signal corresponds to the at least one processed signal.

8. The test logic of claim 7, wherein the set of linear feedback shift registers corresponds to a multiple input shift register structure, and wherein the multiple input shift register structure receives a plurality of input signals, each input signal corresponding to an associated output port of the electronic circuit.

9. The test logic of claim 6, wherein the signature compacter comprises:
a set of linear cellular automata registers, wherein an input signal to the set of linear cellular automata registers corresponds to a corresponding output port of the electronic circuit, and wherein an output of the linear cellular automata registers corresponds to the at least one processed signal.

10. The test logic of claim 1, wherein the source comprises a pattern generator that generates a first set of test signals, each of the first set of test signals being applied one of a plurality of input ports of the electronic circuit.

11. The test logic of claim 10, further comprising:
a multiplexer that selectively couples either the first set of test signals or a second set of test signals to a plurality of multiplexer output ports, the second set of test signals being generated by another source, each multiplexer output port being connected to a corresponding input port of the electronic circuit.

12. The test logic of claim 1, wherein the observe logic module comprises a comparator that compares the second subset of the plurality of output signals with a predetermined value to obtain the at least one processed signal.

13. The test logic of claim 1, wherein the electronic circuit comprises a component of the test logic.

14. A method for testing operation of an electronic circuit, comprising:
(a) providing a plurality of test signals to an electronic device;
(b) partitioning a plurality of output signals into a first subset and a second subset, each of the plurality of output signals being associated with an output port of the electronic device;
(c) coupling the first subset to a plurality of tester IO channels; and
(d) processing the second subset to obtain at least one processed signal, the at least one processed signal being generated from the second subset.

15. The method of claim 14, further comprising:
(e) generating at least one observable signal that is indicative whether a section of the electronic circuit is operating properly, the at least one observable signal being derived from the at least one processed signal.

16. The method of claim 15, further comprising:
(f) analyzing the at least one observable signal to determine whether the section of the electronic circuit is operating properly.

17. The method of claim 15, wherein (e) comprises:
(i) comparing the at least one processed signal with a predetermined value; and
(ii) in response to (i), setting a value of the at least one observable signal.

18. The method of claim 17, wherein the predetermined value is obtained from a processor module.

19. The method of claim 15, wherein one of the at least one observable signal is observable through an IO channel.

20. The method of claim 15, wherein the at least one observable signal is identical or substantially identical to the at least one processed signal.

21. The method of claim 14, wherein the electronic device comprises an integrated circuit.

22. The method of claim 14, wherein (a) comprises:
(i) selecting either a first set of test signals or a second set of test signals to obtain the plurality of test signals, the first set being generated by a pattern generator and the second set being generated by another source; and
(ii) applying the selected test signals to the electronic device.

23. The method of claim 22, wherein the pattern generator is supported by a component of a test logic.

24. The method of claim 14, wherein (d) comprises:
(i) comparing the second subset with a predetermined value: and (ii) in response to (i), setting a value of the at least one processed signal.

25. The method of claim 14, wherein (d) comprises:
(i) generating the at least one processed signal, wherein the at least one processed signal is generated from the second subset of the plurality of output signals.

26. A test logic for testing operation of an electronic circuit, comprising:
a pattern generator that generates a set of test signals, each of the set of test signals corresponding to one of a plurality of input ports of the electronic circuit;
a plurality of tester IO channels that carry a first subset of a plurality of output signals from corresponding output ports of the electronic circuit;
a signature compactor that processes a second subset of the plurality of output signals in order to provide at least one processed signal, the at least one processed signal being generated by the second subset of the plurality of output signals, the signature compactor including a set of linear feedback shift registers, wherein an input signal to the set of linear feedback shift registers corresponds to a corresponding output port of the electronic circuit, and wherein an output signal of the set of linear feedback shift registers corresponds to a corresponding processed signal; and
an interface module that enables determination of whether a section of the electronic circuit is properly operating from at least one observable signal, the at least one observable signal being derived at least in part from the at least one processed signal, the section of the electronic circuit being associated with the second subset of the plurality of output signals.

* * * * *